United States Patent
Boyanov et al.

(10) Patent No.: US 6,703,291 B1
(45) Date of Patent: Mar. 9, 2004

(54) SELECTIVE NIGE WET ETCH FOR TRANSISTORS WITH GE BODY AND/OR GE SOURCE/DRAIN EXTENSIONS

(75) Inventors: Boyan Boyanov, Portland, OR (US); Steven Keating, Beaverton, OR (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/322,390

(22) Filed: Dec. 17, 2002

(51) Int. Cl.[7] .............................. H01L 29/74
(52) U.S. Cl. .................. 438/507; 438/300; 438/520; 438/525; 438/515; 438/587; 438/597; 257/741; 257/766; 257/769
(58) Field of Search ................ 438/362, 507, 438/300, 305, 520, 525, 587, 515, 301, 586, 604, 597; 257/741, 766, 769

(56) References Cited

U.S. PATENT DOCUMENTS

| | | | |
|---|---|---|---|
| 3,659,162 A | * | 4/1972 | Toshio et al. ............ 257/505 |
| 4,188,710 A | * | 2/1980 | Davey et al. ............ 438/508 |
| 5,585,140 A | * | 12/1996 | Brady et al. ............ 427/130 |
| 5,855,993 A | * | 1/1999 | Brady et al. ............ 428/209 |
| 6,084,258 A | * | 7/2000 | Tokushima ............ 257/280 |
| 6,096,590 A | * | 8/2000 | Chan et al. ............ 438/233 |
| 6,313,534 B1 | * | 11/2001 | Nakamura et al. ......... 257/745 |
| 6,437,406 B1 | * | 8/2002 | Lee ............ 257/349 |
| 6,617,654 B2 | * | 9/2003 | Oishi et al. ............ 257/382 |
| 2003/0113989 A1 | * | 6/2003 | Chang ............ 438/587 |

* cited by examiner

Primary Examiner—Matthew Smith
Assistant Examiner—V. Yevsikov
(74) Attorney, Agent, or Firm—Blakely, Sokoloff, Taylor & Zafman LLP

(57) ABSTRACT

The wet etch stage of the salicide process normally used to fabricate polysilicon and silicon-based semiconductor transistors may not be appropriate for germanium-based transistors because the wet etch chemicals at such temperatures will dissolve the germanium leaving no source, gate, or drain for the transistor. In embodiments of the invention, nickel is blanket deposited over the source, drain, and gate regions of the germanium-based transistor, annealed to cause the nickel to react with the germanium, and wet etched to remove un-reacted nickel from dielectric regions (e.g., shallow trench isolation (STI) regions) but leave NiGe in the source, gate, and drain regions. The wet etch is a mild oxidizing solution at room temperature.

23 Claims, 3 Drawing Sheets

US 6,703,291 B1

SELECTIVE NIGE WET ETCH FOR TRANSISTORS WITH GE BODY AND/OR GE SOURCE/DRAIN EXTENSIONS

BACKGROUND

1. Field

Embodiments of the present invention relate to a method of making a semiconductor transistor.

2. Discussion of Related Art

In general, the basic process used in fabricating integrated circuits includes a material deposition stage, a patterning stage, a material removal stage, a doping stage, and a heating stage. The particular stages used depend on the type of devices to be included on the integrated circuit. For example, when the integrated circuit is silicon based with millions of transistors interconnected, the process takes into consideration that features of the transistor, such as the source, drain, and gate, must be formed and that the semiconductor material is silicon.

For such an integrated circuit, fabrication of the transistors typically involves growing a gate dielectric layer on a silicon substrate and forming a polysilicon gate electrode on the gate dielectric layer. Sometimes, shallow trench isolation (STI) regions are formed around the substrate to separate wells in one portion of the substrate from wells in another portion of the substrate. There may also be vertical sidewall spacers formed on the sides of the gate electrode and gate dielectric layer. The silicon substrate, STI regions, spacers, gate electrode, and gate dielectric layer form part of the transistor.

Nickel is deposited over the surface of the transistor and annealed to form NiSi regions in areas where the nickel is in contact with silicon and polysilicon. Thus NiSi is formed on the surface of the gate electrode and on the surface of the substrate, but un-reacted Ni remains on the STI regions and the spacers. The un-reacted Ni is removed by dipping the transistor in a solution of sulfuric acid ($H_2SO_4$), peroxide ($H_2O_2$), and water
($H_2O$) at a temperature around eighty degrees centigrade (80° C. or 176° Fahrenheit), which dissolves the un-reacted Ni the STI regions and the spacers and leaves NiSi to form the source, drain, and gate. This material removal stage is called "wet etch."

The above process (sometimes called a "salicide" process) is adequate for making silicon-based semiconductor transistors, which are the majority of semiconductor transistors being made today. However, with new or other materials being contemplated, such a process may not be appropriate. This is because although fairly common, the particular wet etch chemicals at such temperatures will dissolve certain other semiconductor materials leaving no source, gate, or drain for the transistor.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
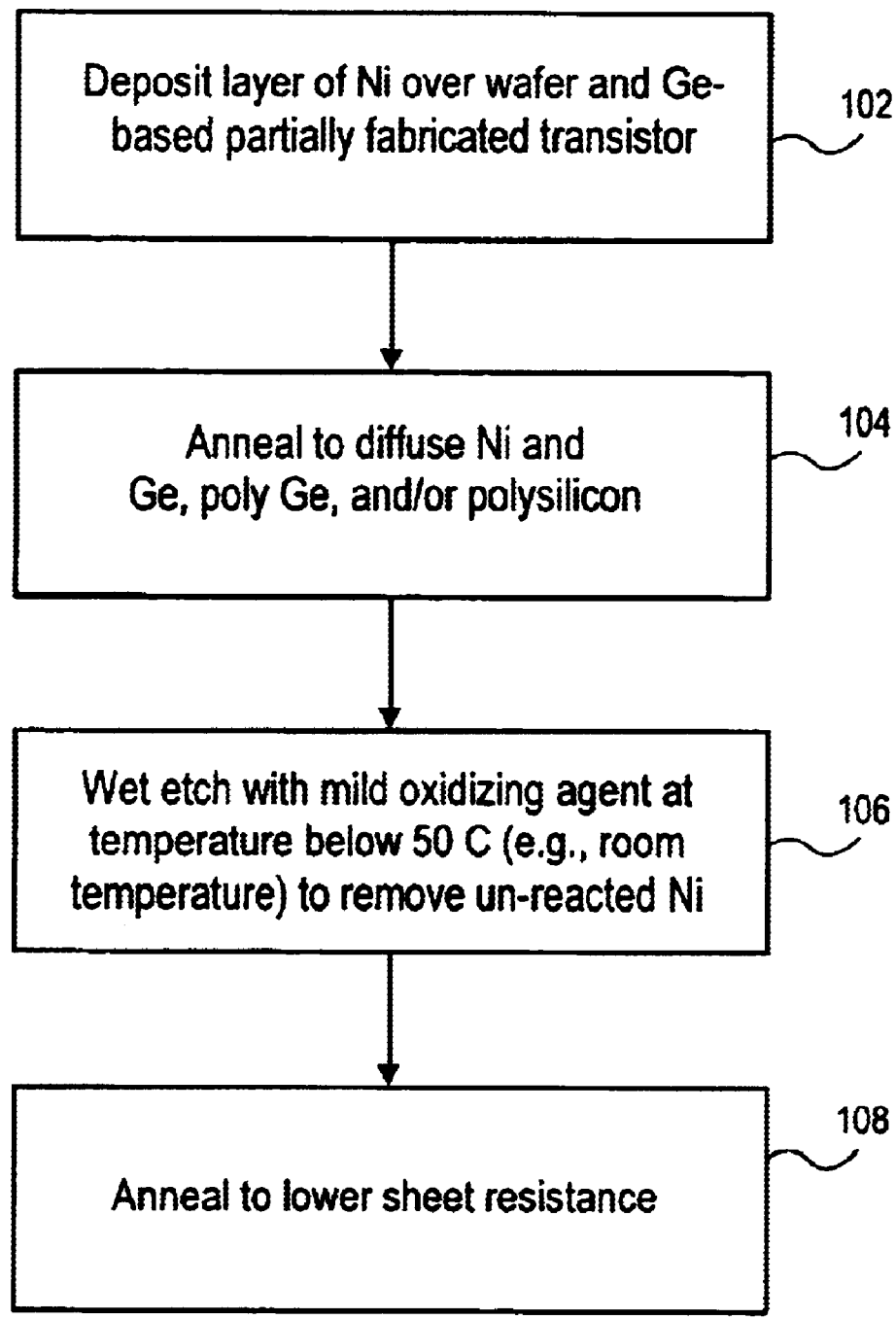
FIG. 1 is a flowchart illustrating a process for fabricating a semiconductor transistor according to an embodiment of the present invention.

Figure is a flowchart illustrating a process 100 for fabricating one or more semiconductor transistors on a wafer according to an embodiment of the present invention. A machine-readable medium with machine-readable instructions thereon may be used to cause a processor to perform the process 100. Of course, the process 100 is only an example process and other processes may be used. The process may be used on batches of wafers or on individual wafers.

In a block 102, nickel (Ni) is deposited over the surface of a semiconductor wafer having one or more partially fabricated transistors. In embodiments of the present invention, Ni may be blanket deposited using well-known or proprietary chemical vapor deposition techniques, sputter deposition techniques, evaporation techniques, or other suitable material deposition technique.

The transistor may include a germanium substrate, a gate dielectric layer formed (e.g., deposited) on the germanium substrate, gate electrode formed on the gate dielectric layer, two dielectric spacers formed on the sides of the gate dielectric layer and the gate electrode, and dielectric shallow trench isolation (STI) regions formed in the wafer. The gate electrode may be poly-germanium, poly-silicon, or other similar semiconductor material.

In a block 104, the transistor is annealed. In an embodiment of the present invention, annealing is accomplished using a rapid thermal process such as rapid thermal anneal (RTA). The annealing temperature may be in the range of 400 to 700 degrees C.

In one embodiment of the present invention, annealing causes Ge and/or the polysilicon to diffuse into the Ni. Nickel in contact with dielectric material remains un-reacted. Ni in contact with Ge forms NiGe, Ni in contact with polysilicon forms NiSi, and Ni in contact with poly-germanium forms NiGe. For example, at an RTA temperature of 425 degrees C NiGe source, drain, and gate regions are formed using a germanium substrate and a poly-germanium gate electrode material. The material in the STI regions and spacers remains un-reacted.

In a block 106, the transistor is selectively wet etched using a mild oxidizing agent at a temperature lower than fifty degrees C for a period of time.

In one embodiment of the present invention, the mild oxidizing agent may be a seventy percent solution nitric acid ($HNO_3$), a ninety percent solution of sulfuric acid ($H_2SO_4$), and water ($H_2O$) at room temperature. The concentration by volume of the nitric acid may be 0.1 percent, the concentration by volume of the sulfuric acid may be 52.9 percent, and the concentration by volume of the water may be 47 percent. Alternatively, the concentration by volume of the nitric acid may range from 0.1 percent to 1.0 percent. The concentration by volume of sulfuric acid may be adjusted accordingly. Of course, the chemistry may be adjusted to ensure that un-reacted Ni is removed to create the source, gate, and drain for the transistor.

The period of time is based on the particular mild oxidizing agent used and the materials of the wafer and transistor. For example, in the embodiment in which the mild oxidizing agent is a seventy percent solution nitric acid ($HNO_3$), a ninety percent solution of sulfuric acid ($H_2SO_4$), and water ($H_2O$) at room temperature, and the concentration by volume of the nitric acid is 0.1 percent, the concentration by volume of the sulfuric acid is 52.9 percent, and the concentration by volume of the water is 47 percent, the transistor may be dipped for as little as one minute and perhaps for more than fifteen minutes. Of course, the period of time may be adjusted to ensure that un-reacted Ni is removed to prevent shorting of the source, gate, and/or drain for the transistor.

The temperature for the wet etch is based on the particular mild oxidizing agent used and the materials of the wafer and transistor. For example, in the embodiment in which the mild oxidizing agent is a seventy percent solution nitric acid ($HNO_3$), a ninety percent solution of sulfuric acid ($H_2SO_4$), and water ($H_2O$) at room temperature, and the concentration by volume of the nitric acid is 0.1 percent, the concentration by volume of the sulfuric acid is 52.9 percent, and the concentration by volume of the water is 47 percent, the temperature may be room temperature. Of course, the temperature may be adjusted to ensure that un-reacted Ni is removed to create the source, gate, and drain for the transistor.

In a block 108, the transistor may be annealed a second time. In one embodiment, the sheet resistance of the transistor is lowered during the second annealing stage.

Figure 2:
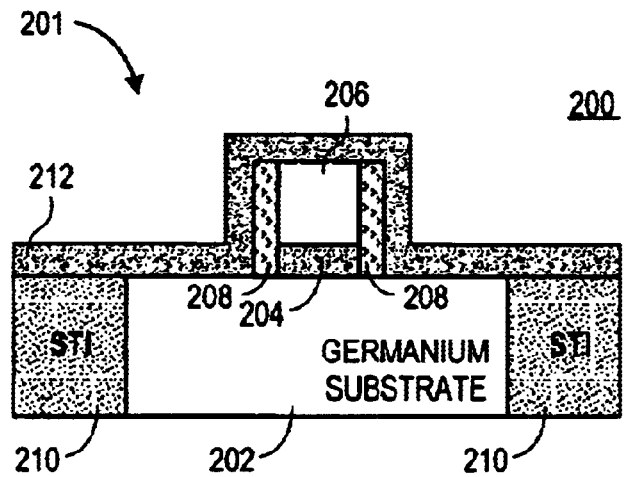
FIG. 2 is a cross-section view of a partially fabricated semiconductor transistor according to an embodiment of the present invention.

FIG. 2 is a cross-section view 200 of a semiconductor wafer having a partially fabricated transistor 201 according to an embodiment of the present invention. The example transistor 201 includes a germanium substrate 202, a gate dielectric layer 204 formed on the germanium substrate 202, a gate electrode 206 formed on the gate dielectric layer 204, two vertical sidewall dielectric spacers 208 formed on the sides of the gate dielectric layer 204 and the gate electrode 206, shallow trench isolation (STI) regions 210 formed in the wafer 200. Nickel has been blanket deposited over the upper surface of the wafer 200 so that the upper surface(s) of the germanium substrate 202, gate dielectric layer 204, gate electrode 206, spacers 208, and STI regions 210 have a layer of nickel 212.

The gate dielectric layer 204 may be any suitable insulator to insulate the gate electrode 206 from the germanium substrate 202. The gate electrode 206 may be polysilicon, poly germanium, or other suitable material. The two vertical sidewall spacers 208 may be dielectric material suitable for preventing nickel from contacting the gate electrode on the sides. The STI regions 210 may be dielectric material and separate the transistor 201 from other transistors formed on the wafer 200.

Figure 3:
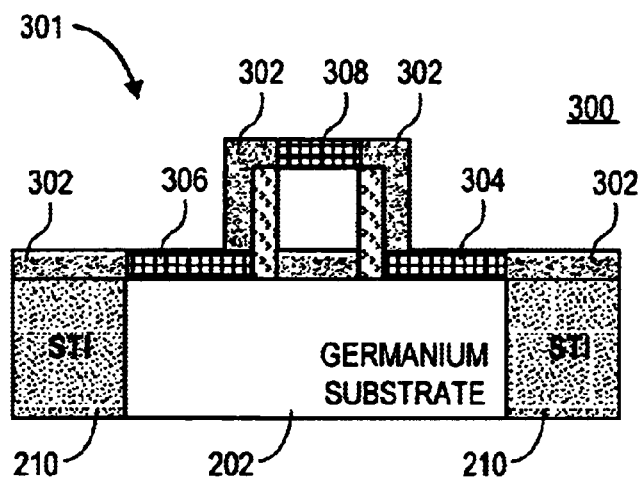
FIG. 3 is a cross-section view of the partially fabricated semiconductor transistor in FIG. 2 after annealing according to an embodiment of the present invention.

FIG. 3 is a cross-section view 300 of a transistor 301, which is the transistor 201 after annealing according to an embodiment of the present invention. The example transistor 301 includes un-reacted nickel regions 302 on the dielectric materials (e.g., STI regions 210 and spacers 208) and NiGe regions 304 and 306 formed on the surface of the germanium substrate 202. There may be a region 308 of nickel poly germanium, nickel polysilicon, or nickel diffused with another material formed on the gate electrode 206.

Figure 4:
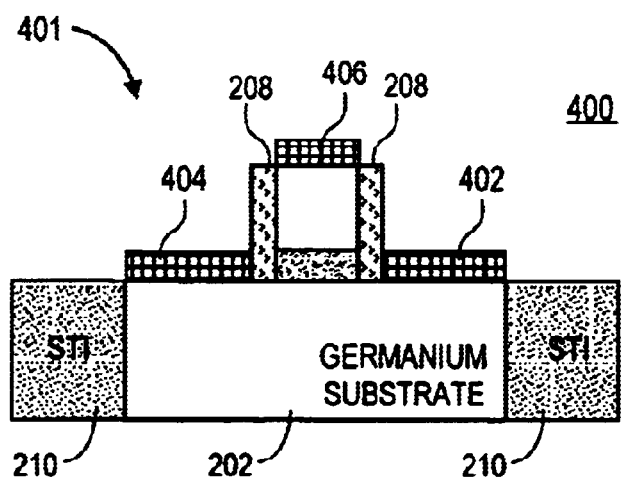
FIG. 4 is a cross-section view of the partially fabricated semiconductor transistor in FIG. 3 after selective wet etching according to an embodiment of the present invention.

FIG. 4 is a cross-section view 400 of a transistor 401, which is the transistor 301 after selective wet etching according to an embodiment of the present invention. The example transistor 401 has un-reacted nickel wet etched from the dielectric materials (e.g., STI regions 210 and spacers 208) and NiGe remains on the surface of the germanium substrate 202 to form metalized contacts. The transistor 410 now includes a source contact 402 and a drain contact 404 formed from the NiGe. The nickel poly germanium, nickel polysilicon, or nickel diffused with another material may remain on the gate electrode 206 to form a gate contact 406 for the transistor 401.

The transistor 401 may be a germanium-based field-effect transistor (FET) with NiGe source/drain contacts and NiGe, Ni-polysilicon, or other nickel-based gate contact.

Figure 5:
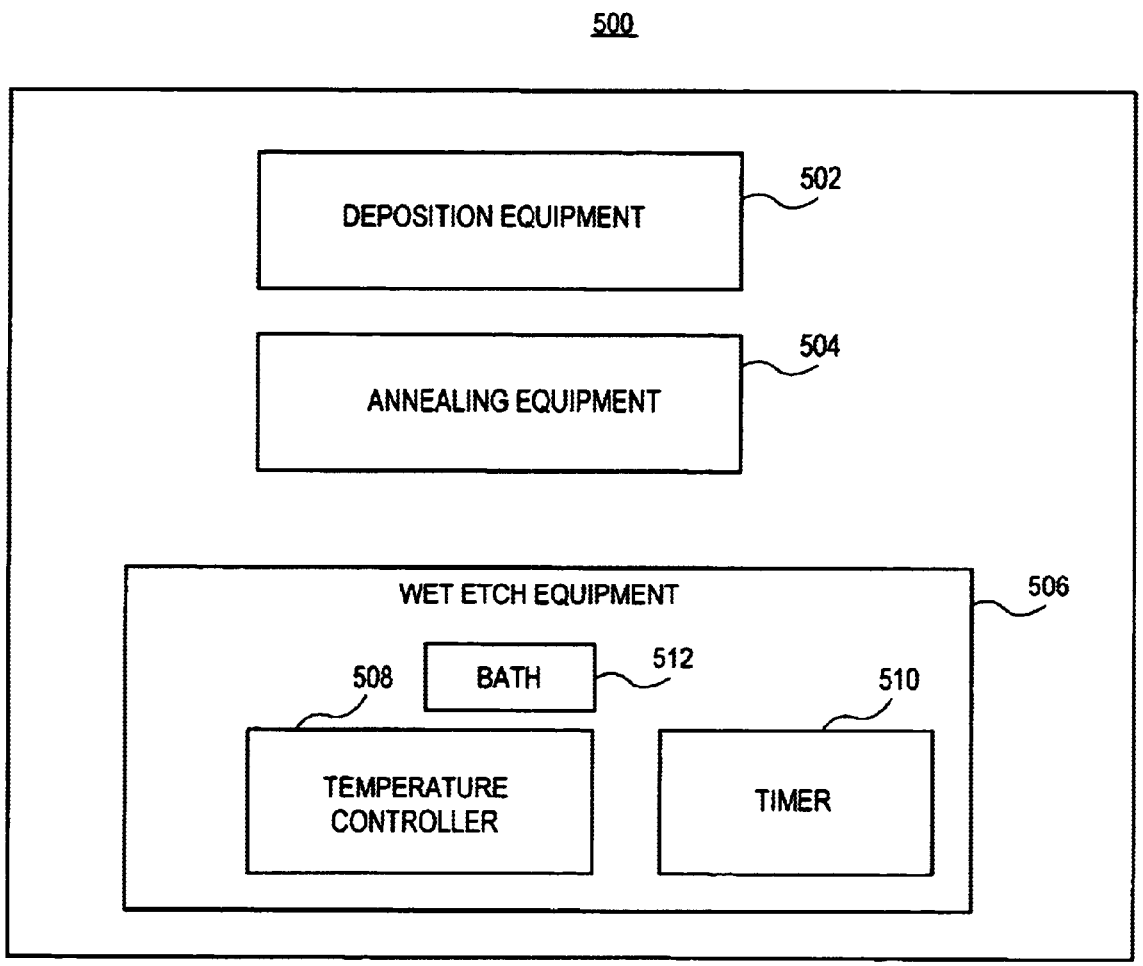
FIG. 5 is a high-level block diagram of a system for fabricating a semiconductor transistor according to an embodiment of the present invention.

FIG. 5 is a high-level block diagram of a system 500 for fabricating a semiconductor transistor according to an embodiment of the present invention. The system 500 includes deposition equipment 502, annealing equipment 504, and wet etch equipment 506.

The deposition equipment 502 may be any equipment suitable for depositing a layer of nickel on a semiconductor wafer and transistors formed in or on the wafer. Such deposition equipment may include evaporators, sputtering equipment, chemical vapor deposition equipment, and the like.

The annealing equipment 504 may be any equipment capable of applying an annealing temperature in the range of 400 to 700 degrees C. Such equipment may include annealing furnaces, rapid thermal anneal (RTA) systems, and other well-known equipment.

The wet etch equipment 502 may include a temperature controller 508, a timer 510, and a bath 512. The temperature controller 508 may be any suitable device capable of maintaining a mild oxidizing agent at a temperature lower than fifty degrees C. Temperature controllers suitable for implementing the temperature controller 508 are well known.

The timer 510 may be any suitable device capable of timing the immersion of semiconductor wafers for a period of time. Timers suitable for implementing the timer 510 are well known.

The bath 512 may be any suitable vessel capable of holding a mild oxidizing agent at a temperature below fifty degrees C, and receiving a wafer for wet etch. In one embodiment, bath 512 holds a seventy percent solution nitric acid ($HNO_3$), a ninety percent solution of sulfuric acid ($H_2SO_4$), and water ($H_2O$) at room temperature, and the concentration by volume of the nitric acid is 0.1 percent, the concentration by volume of the sulfuric acid is 52.9 percent, and the concentration by volume of the water is 47 percent, the temperature may be room temperature.

Embodiments of the invention can be implemented using hardware, software, or a combination of hardware and software. In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

In the following description, numerous specific details, such as particular processes, materials, devices, and so forth, are presented to provide a thorough understanding of embodiments of the invention. One skilled in the relevant art will recognize, however, that the embodiments of the present invention can be practiced without one or more of the specific details, or with other methods, components, etc. In other instances, well-known structures or operations are not shown or described in detail to avoid obscuring the understanding of this description.

Some parts of this description will be presented using terms such as, silicon, polysilicon, annealing, substrate, and so forth. These terms are commonly employed by those skilled in the art to convey the substance of their work to others skilled in the art.

Various operations will be described as multiple discrete blocks performed in turn in a manner that is most helpful in understanding the invention. However, the order in which they are described should not be construed to imply that these operations are necessarily order dependent or that the operations be performed in the order in which the blocks are presented.

Reference throughout this specification to "one embodiment" or "an embodiment" means that a particular feature, structure, process, block, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms used in the following claims should not be construed to limit the invention to the specific embodiments disclosed in the specification and the claims. Rather, the scope of embodiments of the invention is to be determined entirely by the following claims, which are to be construed in accordance with established doctrines of claim interpretation.

What is claimed is:

1. A method of making a semiconductor transistor, comprising:
   forming a layer of nickel over a germanium substrate having a source region, a drain region, and a dielectric isolation region;
   annealing the nickel and germanium substrate to form NiGe in at least one region of the germanium substrate that is in contact with the nickel; and
   wet etching to selectively remove un-reacted Ni and leave NiGe.

2. The method of claim 1, wherein wet etching comprises wet etching using a mild oxidizing agent at a temperature below fifty degrees Centigrade.

3. The method of claim 2, wherein wet etching further comprises wet etching using a seventy percent solution nitric acid ($HNO_3$), a ninety percent solution of sulfuric acid ($H_2SO_4$), and water ($H_2O$).

4. The method of claim 2, wherein wet etching further comprises wet etching at room temperature.

5. The method of claim 2, wherein wet etching comprises wet etching for a period of one minute or more.

6. The method of claim 2, wherein annealing the partially fabricated transistor comprises annealing the partially fabricated transistor at an annealing temperature in the range of 400 to 700 degrees Centigrade.

7. The method of claim 2, further comprising:
   forming polysilicon gate material inside the dielectric isolation region;
   forming the layer of nickel over the polysilicon gate material and the dielectric isolation region;
   annealing to form nickel polysilicon on the gate material and un-reacted nickel in the dielectric isolation region; and
   wet etching to remove un-reacted nickel from the dielectric isolation region and leave nickel polysilicon on the gate material.

8. The method of claim 1, further comprising:
   forming a gate region by depositing polygermanium gate material inside the dielectric isolation region;
   depositing the layer of nickel over the polygermanium gate material;
   annealing to form NiGe in the gate region; and
   wet etching to remove un-reacted Ni from the dielectric isolation region and leave NiGe in the gate region.

9. The method of claim 3, wherein wet etching further comprises wet using a concentration by volume of nitric acid in the range of 0.1 percent to 1.0 percent.

10. A method of making a semiconductor transistor, comprising:
    forming a source region and a drain region on a germanium substrate having a dielectric isolation region, the source and drain regions formed by depositing a layer of nickel over the germanium substrate;
    annealing the nickel and germanium substrate to form NiGe on the germanium substrate; and
    wet etching using a mild oxidizing agent at room temperature to remove un-reacted Ni from the dielectric isolation region and leave NiGe in the source and drain regions.

11. The method of claim 10, further comprising:
    forming a gate region by depositing polysilicon gate material inside the dielectric isolation region;
    depositing the layer of nickel over the polysilicon gate material;
    annealing to form nickel polysilicon in the gate region; and
    wet etching to remove un-reacted Ni from the dielectric isolation region and leave nickel polysilicon in the gate region.

12. The method of claim 10, further comprising:
    forming a gate region by depositing polygermanium gate material inside the dielectric isolation region;
    depositing the layer of nickel over the polygermanium gate material;
    annealing to form NiGe in the gate region; and
    wet etching to remove un-reacted Ni from the dielectric isolation region and leave NiGe in the gate region.

13. A semiconductor transistor, comprising:
    a germanium substrate;
    a NiGe source contact and a NiGe drain contact formed on the germanium substrate.

14. The semiconductor transistor of claim 13, further comprising a gate dielectric layer formed on the germanium substrate.

15. The semiconductor transistor of claim 14, further comprising a gate electrode formed on the gate dielectric layer.

16. The semiconductor transistor of claim 15, further comprising dielectric spacers formed on the gate electrode.

17. The semiconductor transistor of claim 15, wherein the gate electrode is a Ni polySi gate electrode.

18. The semiconductor transistor of claim 15, wherein the gate electrode is a Ni polyGe gate electrode.

19. A system for fabricating a semiconductor transistor, comprising:

a semiconductor transistor having at least one annealed NiGe region;

mild oxidizing agent bath coupled to receive the semiconductor transistor; and a temperature controller coupled to the mild oxidizing agent bath to control a mild oxidizing agent at a temperature below fifty degrees Centigrade.

20. The system of claim 19, wherein the temperature controller is to control a mild oxidizing agent at a temperature below fifty degrees Centigrade.

21. The system of claim 20, wherein the temperature controller is to control a mild oxidizing agent at room temperature.

22. The system of claim 19, wherein the mild oxidizing agent bath comprises a seventy percent solution nitric acid ($HNO_3$), a ninety percent solution of sulfuric acid ($H_2SO_4$), and water ($H_2O$).

23. The system of claim 22, wherein the concentration by volume of the nitric acid is 0.1 percent, the concentration by volume of the sulfuric acid is 52.9 percent, and the concentration by volume of the water is 47 percent.

* * * * *